US012635388B2

(12) United States Patent
Lee et al.

(10) Patent No.: US 12,635,388 B2
(45) Date of Patent: May 19, 2026

(54) DISPLAY DEVICE AND METHOD OF MANUFACTURING THE SAME

(71) Applicant: Samsung Display Co., LTD., Yongin-si (KR)

(72) Inventors: Kwang-Min Lee, Yongin-si (KR); Junhwi Lim, Yongin-si (KR); Min-Uk Kim, Yongin-si (KR); Ho-Yong Shin, Yongin-si (KR); Seon Uk Lee, Yongin-si (KR); Kang Soo Han, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 385 days.

(21) Appl. No.: 18/308,749

(22) Filed: Apr. 28, 2023

(65) Prior Publication Data

US 2024/0099103 A1 Mar. 21, 2024

(30) Foreign Application Priority Data

Sep. 15, 2022 (KR) ........................ 10-2022-0116130

(51) Int. Cl.
*H10K 59/80* (2023.01)
*H10K 59/12* (2023.01)
(Continued)

(52) U.S. Cl.
CPC ....... *H10K 59/873* (2023.02); *H10K 59/1201* (2023.02); *H10K 59/122* (2023.02); *H10K 59/38* (2023.02)

(58) Field of Classification Search
CPC ............. H10K 59/873; H10K 59/1201; H10K 59/122; H10K 59/38
(Continued)

(56) References Cited

U.S. PATENT DOCUMENTS

2004/0017526 A1* 1/2004 Kuo ................... G02F 1/136209
349/110
2004/0233376 A1* 11/2004 Chung ................... G02F 1/1339
349/153

(Continued)

FOREIGN PATENT DOCUMENTS

KR 1020130143300 A 12/2013
KR 10-2014-0016474 2/2014
(Continued)

*Primary Examiner* — Dzung Tran
(74) *Attorney, Agent, or Firm* — CANTOR COLBURN LLP

(57) ABSTRACT

A display device includes a display area, a peripheral area disposed outside the display area, and a sealing area disposed outside the peripheral area, a first base substrate, a second base substrate facing the first base substrate, a color filter layer disposed under the first base substrate, a bank layer disposed under the color filter layer, and a sealing member disposed between the bank layer and the second base substrate in the sealing area. The bank layer includes bank patterns defining an opening disposed at least in the sealing area, and the sealing member fills the opening. Each of the bank patterns includes a first surface adjacent to the color filter layer and a second surface opposite to the first surface and adjacent to the sealing member. A width of the second surface is greater than a width of the first surface.

7 Claims, 15 Drawing Sheets

(51) Int. Cl.
    *H10K 59/122*       (2023.01)
    *H10K 59/38*        (2023.01)

(58) Field of Classification Search
    USPC ........................................................... 257/91
    See application file for complete search history.

(56)               References Cited

U.S. PATENT DOCUMENTS

| | | | |
|---|---|---|---|
| 2007/0291216 A1 | 12/2007 | Chan et al. | |
| 2013/0342889 A1 | 12/2013 | Kim et al. | |
| 2016/0195741 A1* | 7/2016 | Shiau | G02F 1/1339 |
| | | | 349/123 |
| 2019/0025634 A1* | 1/2019 | Park | G02F 1/133377 |
| 2020/0326586 A1* | 10/2020 | Kim | G02F 1/133516 |
| 2021/0359011 A1* | 11/2021 | Lee | H10K 59/8792 |

FOREIGN PATENT DOCUMENTS

| | | |
|---|---|---|
| KR | 10-2018580 | 9/2019 |
| KR | 10-2020-0135130 | 12/2020 |
| KR | 10-2021-0146468 | 12/2021 |
| KR | 10-2022-0046028 | 4/2022 |

* cited by examiner

FIG. 5
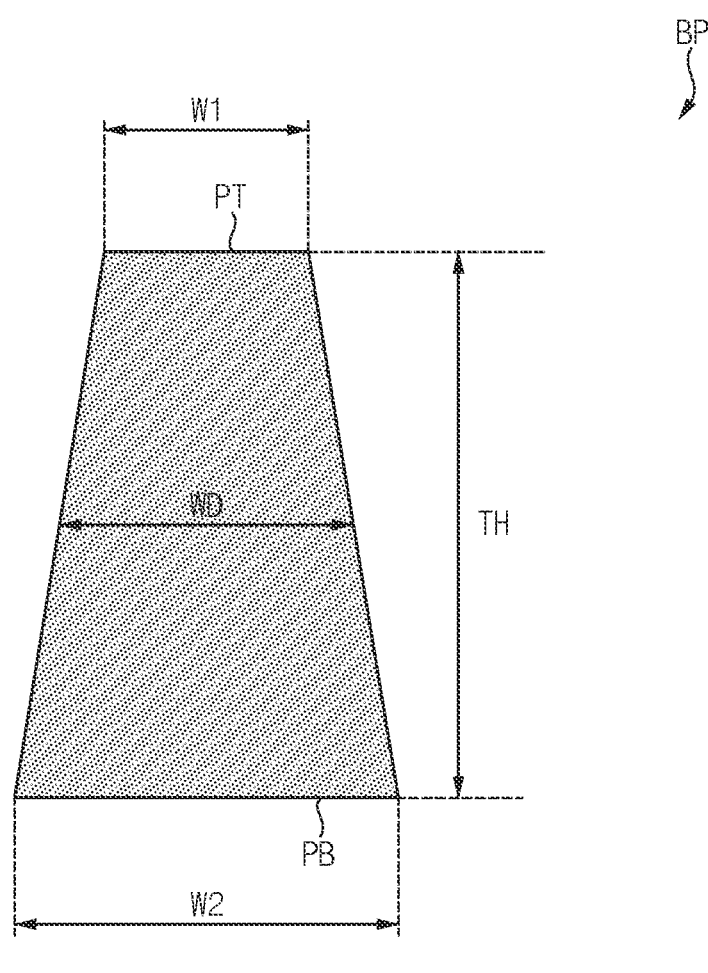
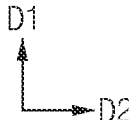

F I G. 6
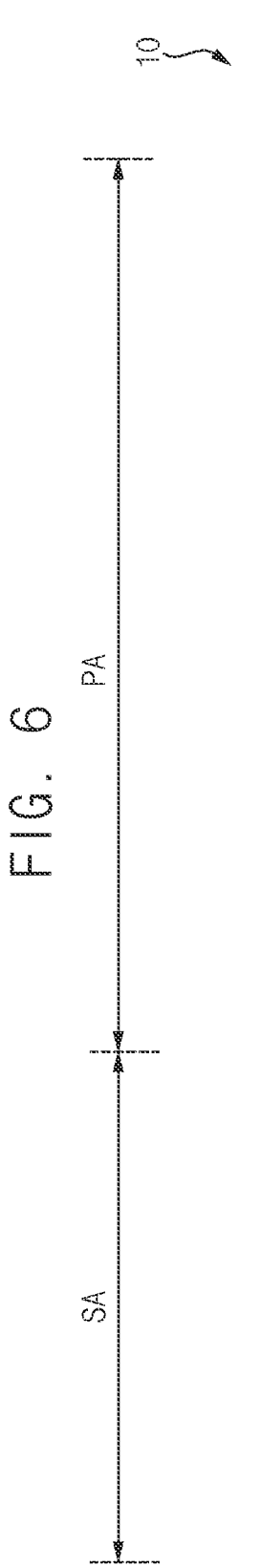
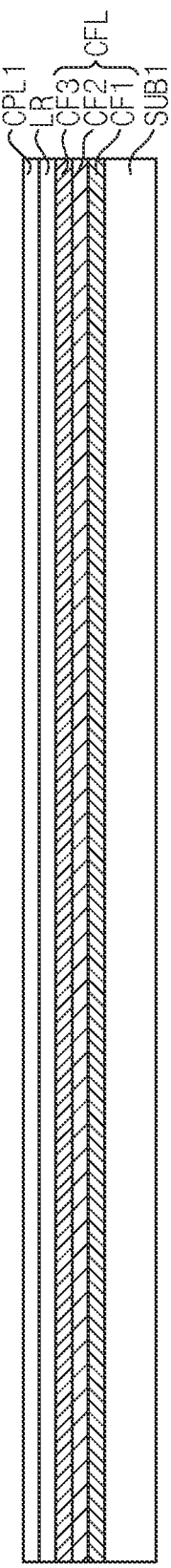

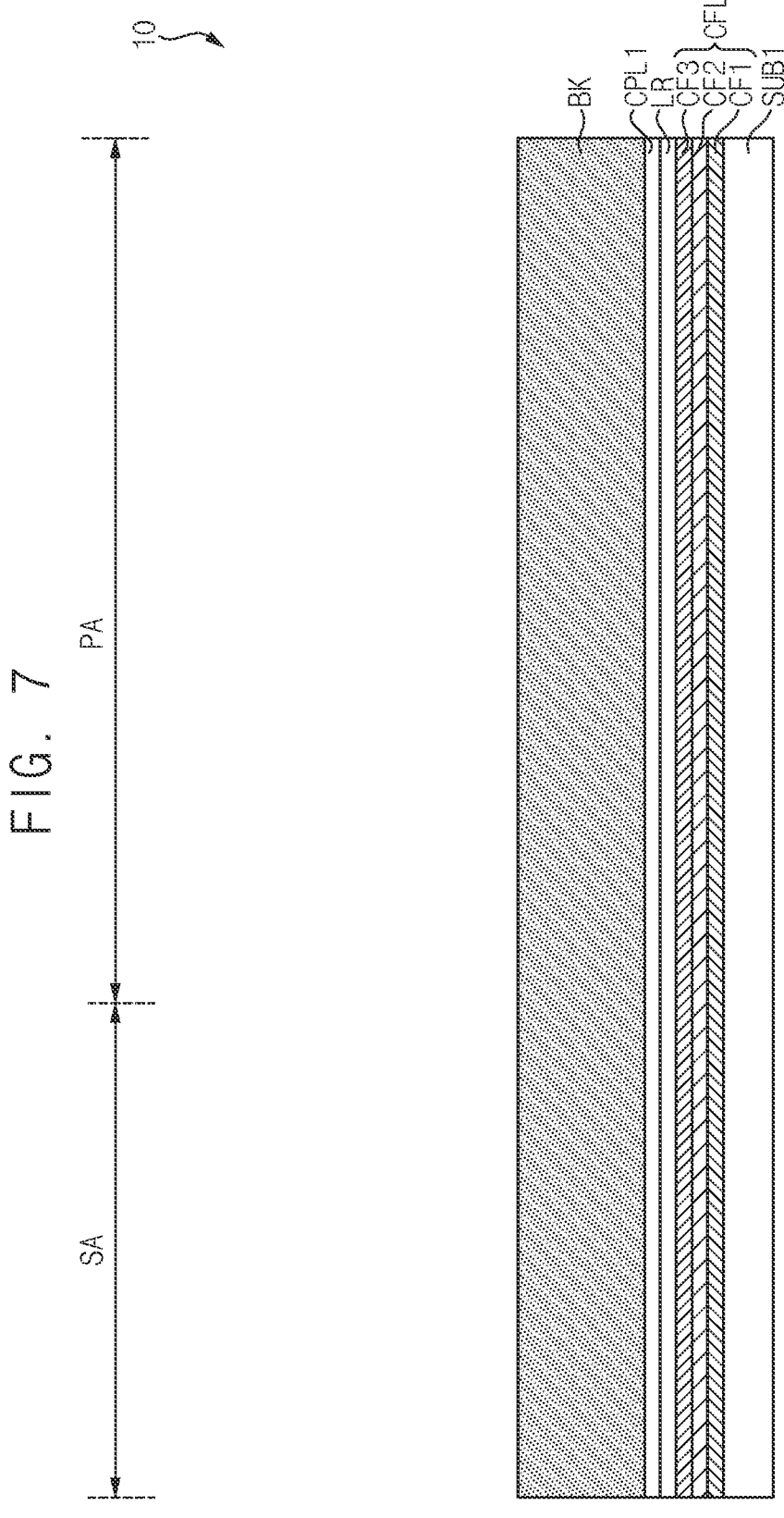
F I G . 7

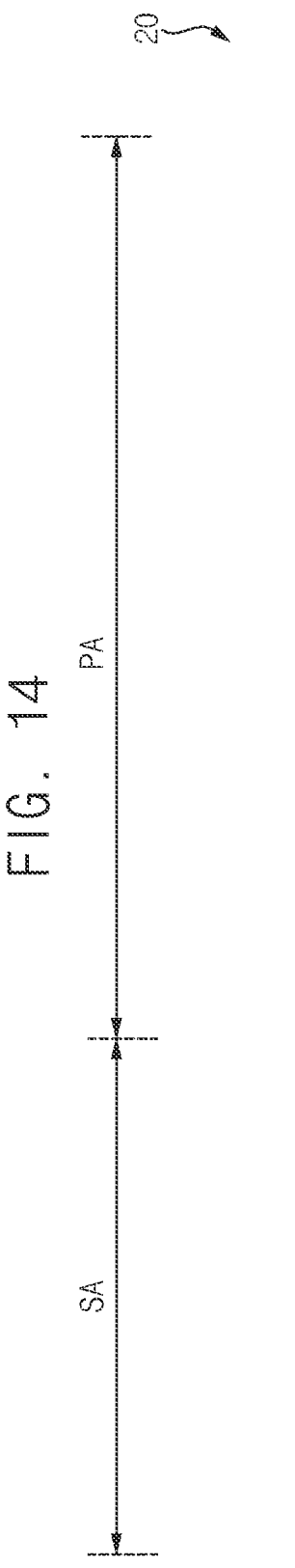
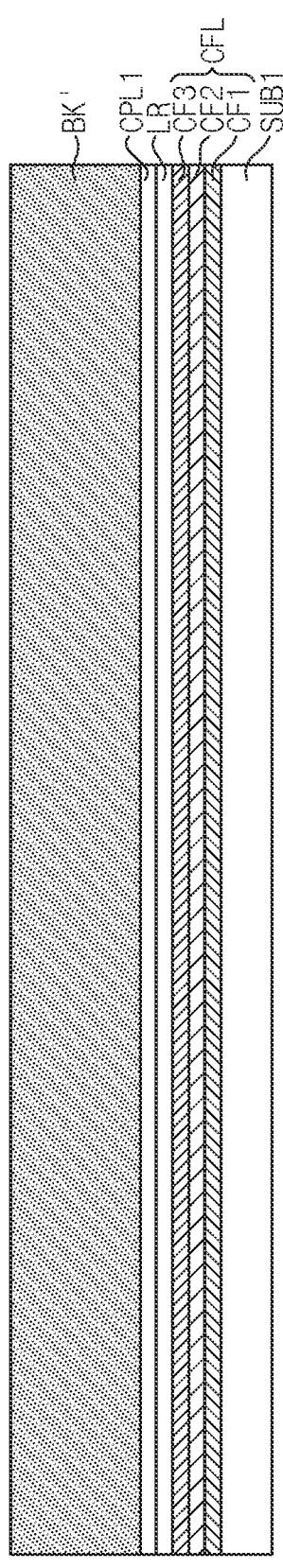
FIG. 14

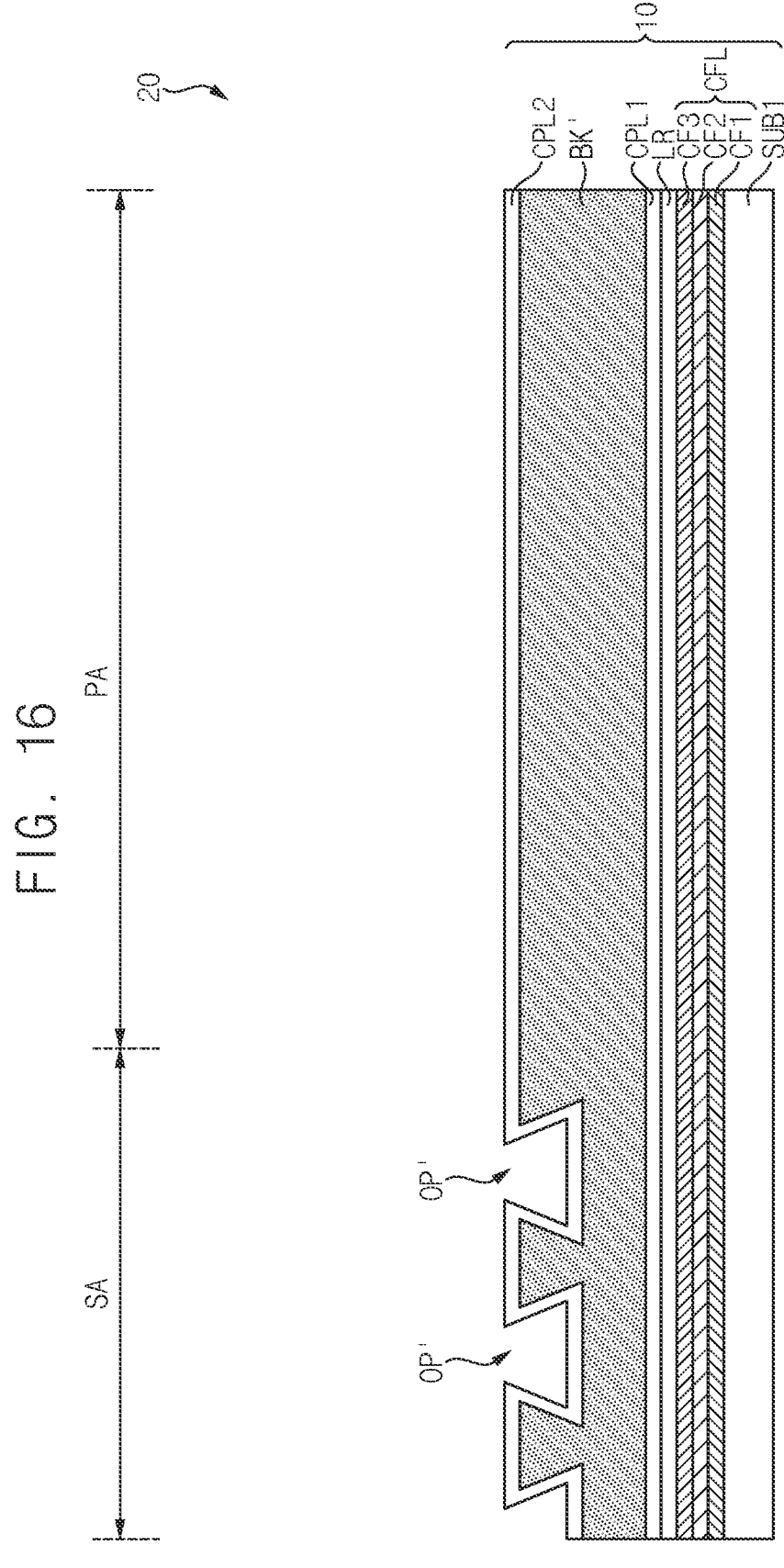
F I G .  1 6

F I G . 17
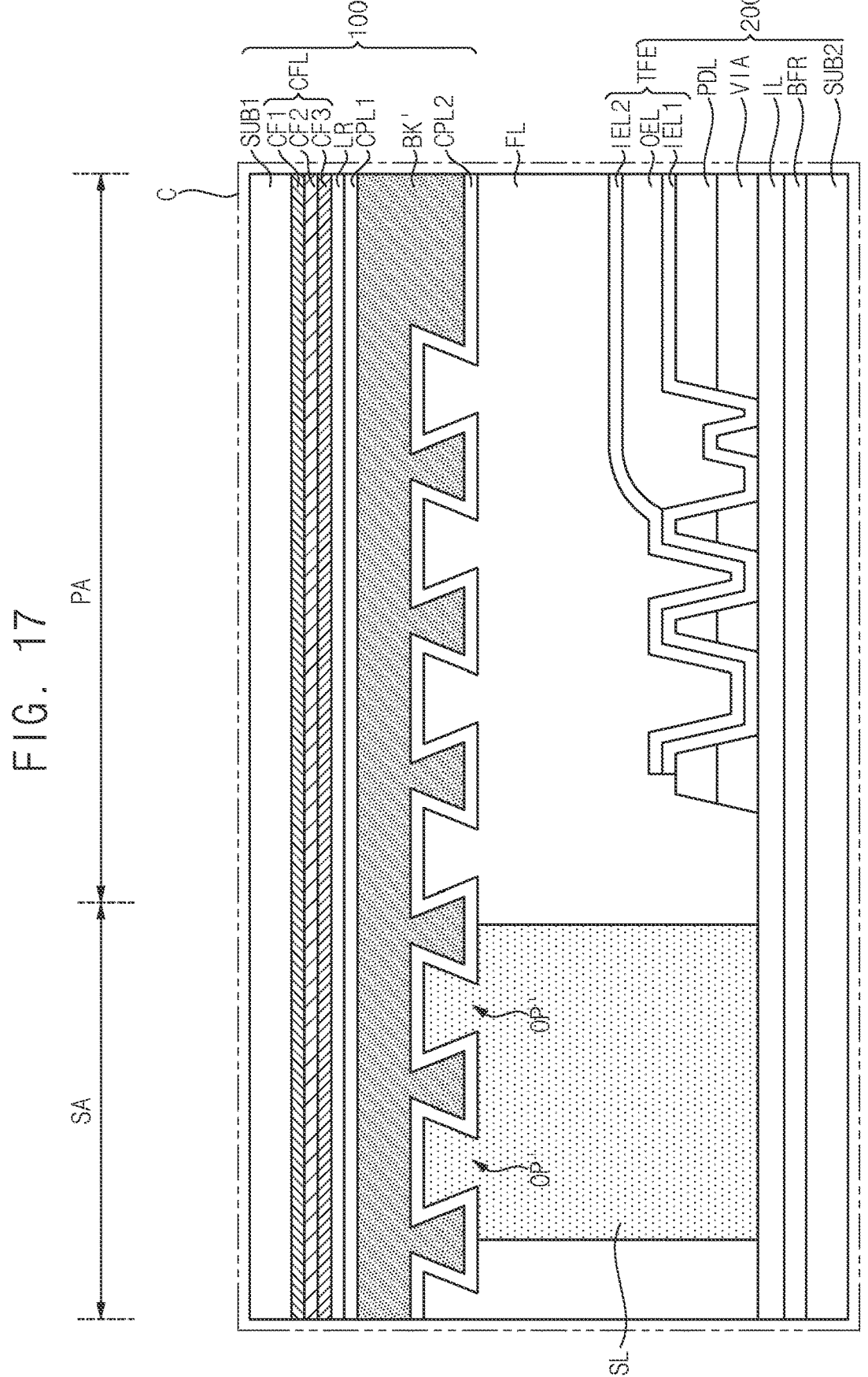

DISPLAY DEVICE AND METHOD OF MANUFACTURING THE SAME

CROSS-REFERENCE TO RELATED APPLICATION(S)

This application claims priority to and benefits of Korean Patent Application No. 10-2022-0116130 under 35 U.S.C. § 119, filed on Sep. 15, 2022 in the Korean Intellectual Property Office (KIPO), the entire disclosure of which is incorporated herein by reference.

BACKGROUND

1. Technical Field

Embodiments relate to a display device and a method of manufacturing the same. More particularly, embodiments relate to a display device providing visual information and a method of manufacturing the same.

2. Description of the Related Art

A display device is a device that displays an image to provide visual information to a user. Representative examples of such a display device include a liquid crystal display device and an organic light emitting display device.

Recently, in order to improve display quality, a display device including a display substrate including pixels and a color conversion substrate including a color filter layer and a color conversion layer has been proposed. The color conversion layer may convert a wavelength of light provided from the display substrate. Accordingly, the display device including the color conversion layer may emit light having a color different from that of incident light. For example, the color conversion layer may include wavelength conversion particles such as quantum dots.

SUMMARY

Embodiments provide a display device with improved reliability.

Embodiments provide a method of manufacturing the display device.

It should be noted that objects of the disclosure are not limited to the above-described objects, and other objects of the disclosure will be apparent to those skilled in the art from the following descriptions.

A display device according to an embodiment may include a display area, a peripheral area disposed outside the display area, and a sealing area disposed outside the peripheral area, a first base substrate, a second base substrate facing the first base substrate, a color filter layer disposed under the first base substrate, a bank layer disposed under the color filter layer, and a sealing member disposed between the bank layer and the second base substrate in the sealing area. The bank layer may include bank patterns defining an opening disposed at least in the sealing area. Each of the bank patterns may include a first surface adjacent to the color filter layer and a second surface opposite to the first surface and adjacent to the sealing member. A width of the second surface may be greater than a width of the first surface. A thickness of each of the bank patterns may be about 10 μm to about 13 μm. The sealing member may fill the opening.

In an embodiment, the width of the second surface may be about 11 μm to about 17 μm.

In an embodiment, the width of the first surface may be about 11 μm or less.

In an embodiment, the bank patterns may be additionally disposed in the peripheral area.

In an embodiment, the display device may further include a filler disposed between the bank layer and the second base substrate and filling the opening in the peripheral area.

In an embodiment, the bank layer may include a light blocking material.

In an embodiment, the display device may further include a first capping layer disposed between the color filter layer and the bank layer.

In an embodiment, the display device may further include a second capping layer covering the second surface of the bank pattern.

In an embodiment, the second capping layer and the first capping layer may contact each other in an area overlapping the opening in a plan view.

A display device according to an embodiment may include a display area, a peripheral area disposed outside the display area, and a sealing area disposed outside the peripheral area, a first base substrate, a second base substrate facing the first base substrate, a color filter layer disposed under the first base substrate, a bank layer disposed under the color filter layer, and a sealing member disposed between the bank layer and the second base substrate in the sealing area. A thickness of the bank layer may be 13 μm or less. Recesses may be defined at least in the sealing area of the bank layer, and may include side surfaces of an inclined structure. The sealing member may fill the recesses.

In an embodiment, the side surfaces of the recesses may have an acute inclination angle with respect to bottom surfaces of the recesses.

In an embodiment, the recesses may be additionally disposed in the peripheral area.

In an embodiment, the display device may further include a filler disposed between the bank layer and the second base substrate and filling the recesses in the peripheral area.

In an embodiment, the display device may further include a first capping layer disposed between the color filter layer and the bank layer.

In an embodiment, the display device may further include a second capping layer covering the side surfaces and bottom surfaces of the recesses.

In an embodiment, the first capping layer and the second capping layer are spaced apart from each other in an area overlapping the recesses in a plan view.

A method of manufacturing a display device according to an embodiment may include providing a first base substrate defining a display area, a peripheral area disposed outside the display area, and a sealing area disposed outside the peripheral area, forming a color filter layer on the first base substrate, forming a bank layer on the color filter layer, exposing the bank layer to light using a mask having a halftone area, forming recesses corresponding to the halftone area in the sealing area by developing the exposed bank layer, and filling the recesses with a sealing member.

In an embodiment, the recesses may include side surfaces of an inclined structure, and the side surfaces of the recesses may have an acute inclination angle with respect to bottom surfaces of the recesses.

In an embodiment, the recesses may be additionally formed in the peripheral area.

In an embodiment, the method may further include filling the recesses in the peripheral area with a filler.

In a display device according to embodiments of the disclosure, a bank layer may be disposed in a display area, a peripheral area and a sealing area, and may include bank patterns disposed in the sealing area and defining an opening. As a sealing member fills the opening, a contact area and contact density between the bank layer and the sealing member may be increased, and physical adhesion between the bank layer and the sealing member may be improved. In addition, since a gap between a color conversion substrate and an array substrate is secured in the peripheral area and the sealing area, edge defects of the display device may be improved. In addition, since a process for a separate column space is not required, a manufacturing process of the display device may be simplified. Accordingly, reliability and productivity of the display device may be improved.

BRIEF DESCRIPTION OF THE DRAWINGS

FIG. 5 is a schematic enlarged cross-sectional view of a bank pattern of FIG. 4.

FIGS. 6, 7 and 8 are schematic cross-sectional views for illustrating a method of manufacturing a color conversion substrate included in the display device of FIG. 1.

FIGS. 14, 15 and 16 are schematic cross-sectional views for illustrating a method of manufacturing a color conversion substrate included in the display device of FIG. 10.

FIG. 17 is a schematic cross-sectional view illustrating another example of FIG. 12.

DETAILED DESCRIPTION OF THE EMBODIMENTS

Figure 1:
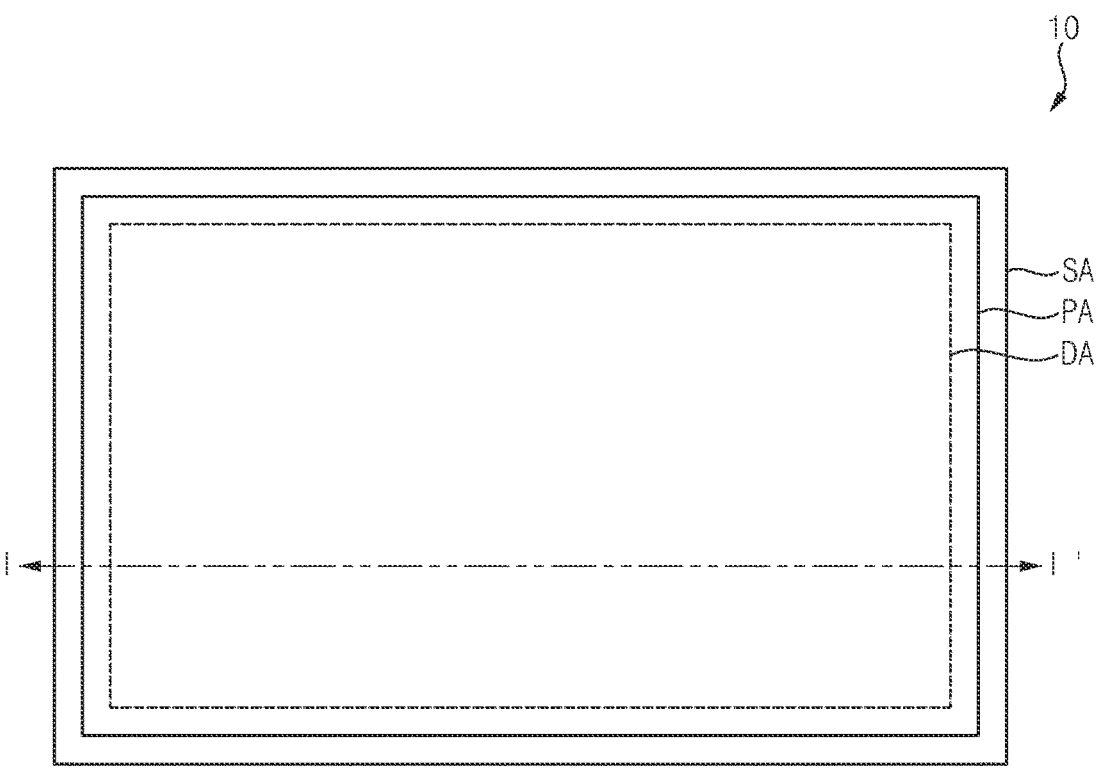
FIG. 1 is a schematic plan view illustrating a display device according to an embodiment.

Hereinafter, display devices in accordance with embodiments will be described in more detail with reference to the accompanying drawings. The same reference numerals are used for the same components in the drawings, and redundant descriptions of the same components will be omitted.

The term "about" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Spatially relative terms, such as "beneath," "below," "under," "lower," "on," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein should be interpreted accordingly.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements.

The term "and/or" includes all combinations of one or more of which associated configurations may define. For example, "A and/or B" may be understood to mean "A, B, or A and B."

For the purposes of this disclosure, the phrase "at least one of A and B" may be construed as A only, B only, or any combination of A and B. Also, "at least one of X, Y, and Z" and "at least one selected from the group consisting of X, Y, and Z" may be construed as X only, Y only, Z only, or any combination of two or more of X, Y, and Z.

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

Figure 2:
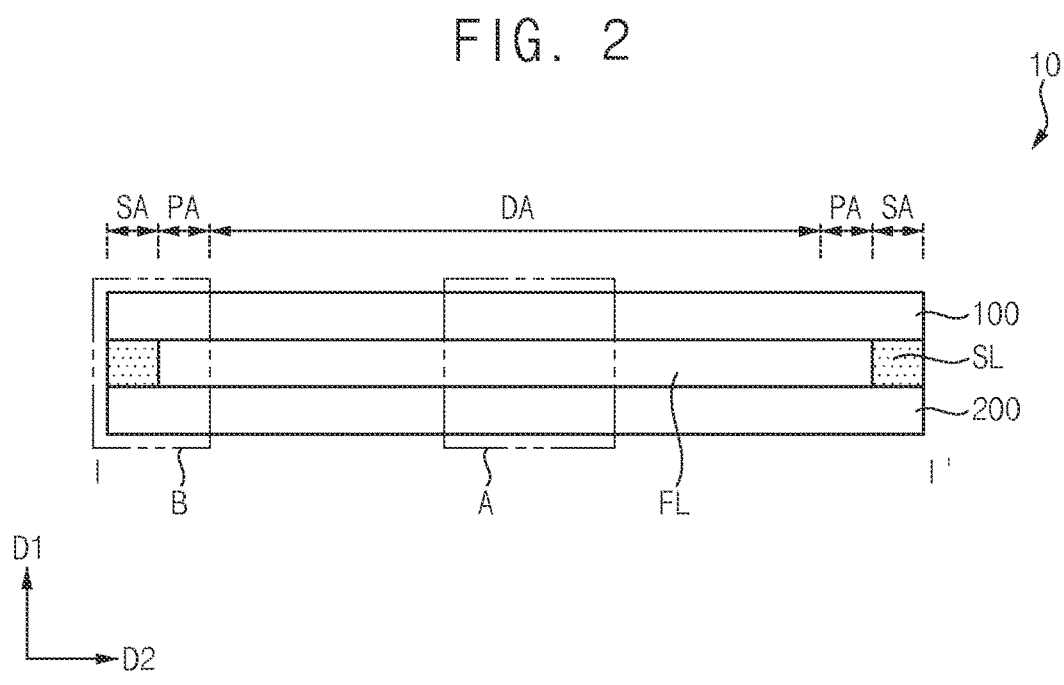
FIG. 2 is a schematic cross-sectional view taken along line I-I' of FIG. 1.

FIG. 1 is a schematic plan view illustrating a display device according to an embodiment. FIG. 2 is a schematic cross-sectional view taken along line I-I' of FIG. 1.

Referring to FIGS. 1 and 2, a display device 10 may include a color conversion substrate 100, an array substrate 200 and a sealing member SL. The color conversion substrate 100 may face the array substrate 200. The color conversion substrate 100 may be positioned in a first direction D1 from the array substrate 200. The sealing member SL may be disposed between the color conversion substrate 100 and the array substrate 200. The sealing member SL may attach the color conversion substrate 100 and the array substrate 200 to each other.

A display area DA on which an image is displayed, a peripheral area PA located adjacent to or around the display area DA and a sealing area SA located adjacent to or around the peripheral area PA may be defined in the display device 10. The peripheral area PA may be located outside the display area DA. For example, the peripheral area PA may surround the display area DA in a plan view. The sealing area SA may be located outside the peripheral area PA. For example, the sealing area SA may surround the peripheral area PA in a plan view.

The color conversion substrate 100 may include a color conversion layer (e.g., a color conversion layer CCL of FIG.

3). The color conversion layer may be disposed in the display area DA, and may convert a wavelength of light generated from light emitting elements (e.g., first, second and third light emitting elements LED1, LED2 and LED3 of FIG. 3) of the array substrate 200. The color conversion substrate 100 may further include a color filter layer (e.g., a color filter layer CFL of FIG. 3) that transmits light of a specific color.

The array substrate 200 may include pixels, and may be referred to as a display substrate. The pixels may be disposed in the display area DA of the array substrate 200. Each of the pixels may include a driving diode and a light emitting diode. The driving diode may include at least one thin-film transistor. The light emitting diode may generate light according to a driving signal. For example, the light emitting diode may be an inorganic light emitting diode and/or an organic light emitting diode.

The sealing member SL may attach the color conversion substrate 100 and the array substrate 200 to each other. The sealing member SL may be disposed in the sealing area SA between the color conversion substrate 100 and the array substrate 200. For example, the sealing member SL may be disposed in the sealing area SA between the color conversion substrate 100 and the array substrate 200 so as to surround the peripheral area PA in a plan view. In an embodiment, the sealing member SL may have a hollow rectangular planar shape. However, the configuration of the disclosure is not limited thereto, and the sealing member SL may have various planar shapes depending on a planar shape of the color conversion substrate 100 or the array substrate 200. For example, in case that the color conversion substrate 100 or the array substrate 200 has a planar shape such as a triangle, a rhombus, a polygon, a circle or an ellipse, the sealing member SL may have a planar shape such as a hollow triangle, a hollow rhombus, a hollow polygon, a hollow circle or a hollow oval.

In an embodiment, a filler FL may be disposed between the color conversion substrate 100 and the array substrate 200. In an embodiment, the filler FL may maintain a gap between the color conversion substrate 100 and the array substrate 200. For example, the filler FL may act as a buffer against external pressure applied to the display device 10.

Figure 3:
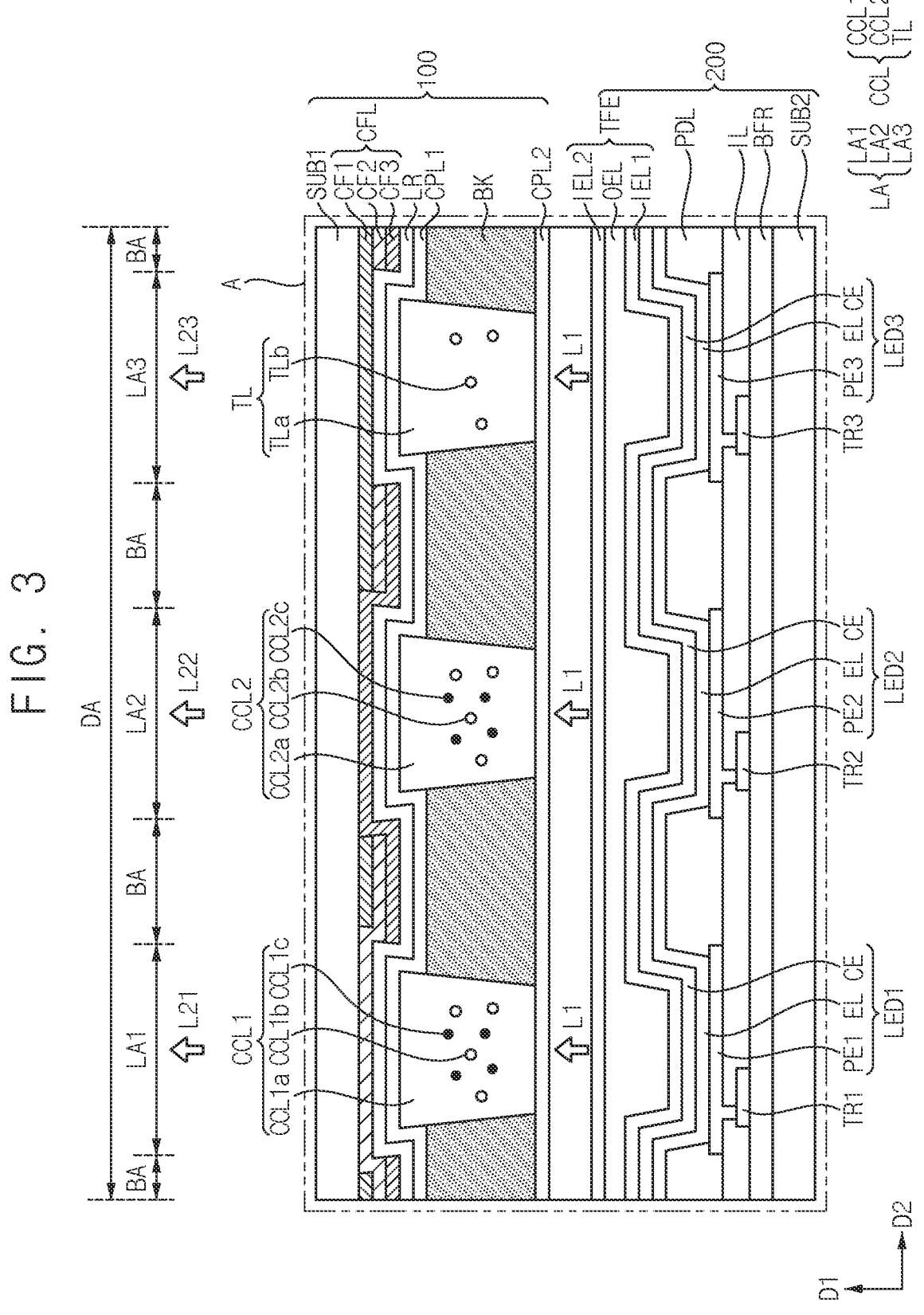
FIG. 3 is a schematic enlarged cross-sectional view of area A of FIG. 2.

FIG. 3 is a schematic enlarged cross-sectional view of area A of FIG. 2. For example, FIG. 3 may be a schematic cross-sectional view illustrating the display area DA of the display device 10 of FIG. 1.

Referring to FIGS. 1, 2 and 3, the display area DA may include a light emitting area LA and a light blocking area BA. Light (hereinafter, incident light) L1 generated by the array substrate 200 and incident on the color conversion substrate 100 may be emitted to the outside through the light emitting area LA. The light emitting area LA may include first, second and third light emitting areas LA1, LA2 and LA3 for emitting light of different colors. In an embodiment, first transmission light L21 having red color may be emitted from the first light emitting area LA1. Second transmission light L22 having green color may be emitted from the second light emitting area LA2. Third transmission light L23 having blue color may be emitted from the third light emitting area LA3. However, the disclosure is not limited thereto.

In an embodiment, the first, second and third light emitting areas LA1, LA2 and LA3 may be spaced apart from each other in a plan view, and may be arranged to repeat each other. The light blocking area BA may surround the first, second and third light emitting areas LA, LA2 and LA3 in a plan view. For example, the light blocking area BA may have a matrix shape in a plan view.

The color conversion substrate 100 may include a first base substrate SUB1, a color filter layer CFL, a low-refractive-index layer LR, a first capping layer CPL1, a bank layer BK, a color conversion layer CCL and a second capping layer CPL2.

The first base substrate SUB1 may include a transparent material. Examples of materials that may be used as the first base substrate SUB1 may include at least one of glass, plastic, and the like. In an embodiment, the first base substrate SUB1 may include the display area DA, the peripheral area PA and the sealing area SA.

The color filter layer CFL may be disposed under the first base substrate SUB1. The color filter layer CFL may include a first color filter CF1, a second color filter CF2 and a third color filter CF3.

In an embodiment, the first color filter CF1 may overlap the third light emitting area LA3, and may selectively transmit blue light. The second color filter CF2 may overlap the first light emitting area LA1, and may selectively transmit red light. The third color filter CF3 may overlap the second light emitting area LA2, and may selectively transmit green light. However, the disclosure is not limited thereto.

In an embodiment, each of the first color filter CF1, the second color filter CF2 and the third color filter CF3 may be disposed to overlap the light blocking area BA. For example, as shown in FIG. 3, the first color filter CF1 may overlap the third light emitting area LA3 and the light blocking area BA, and may not overlap the first and second light emitting areas LA1 and LA2. The second color filter CF2 may overlap the first light emitting area LA1 and the light blocking area BA, and may not overlap the second and third light emitting areas LA2 and LA3. The third color filter CF3 may overlap the second light emitting area LA2 and the light blocking area BA, and may not overlap the first and third light emitting areas LA1 and LA3. In the blocking area BA, portions of each of the first, second and third color filters CF1, CF2 and CF3 may overlap each other in the first direction D1. Accordingly, color mixing between adjacent first, second and third light emitting areas LA1, LA2 and LA3 may be prevented.

In an embodiment, the color filter layer CFL may be disposed under the first base substrate SUB1, and may overlap the display area DA, the peripheral area PA and the sealing area SA. For example, the color filter layer CFL may extend from the display area DA to the peripheral area PA and the sealing area SA.

The low-refractive-index layer LR may be disposed under the color filter layer CFL. In an embodiment, the low-refractive-index layer LR may include an organic material. The low-refractive-index layer LR may have a lower refractive index than the color conversion layer CCL. The low-refractive-index layer LR may increase luminance and lifespan of the display device 10 by improving light extraction efficiency.

In an embodiment, the low-refractive-index layer LR may be disposed under the color filter layer CFL, and may overlap the display area DA, the peripheral area PA and the sealing area SA. For example, the low-refractive-index layer LR may extend from the display area DA to the peripheral area PA and the sealing area SA.

The first capping layer CPL1 may be disposed under the low-refractive-index layer LR, and may cover the low-refractive-index layer LR. In an embodiment, the first capping layer CPL1 may include an inorganic material.

Examples of inorganic materials that may be used as the first capping layer CPL1 may include at least one of silicon oxide, silicon nitride, and the like. These may be used alone or in combination with each other.

In an embodiment, the first capping layer CPL1 may be disposed under the low-refractive-index layer LR, and may overlap the display area DA, the peripheral area PA and the sealing area SA. For example, the first capping layer CPL1 may extend from the display area DA to the peripheral area PA and the sealing area SA.

The bank layer BK may be disposed under the color filter layer CFL. An opening exposing at least a portion of the first capping layer CPL1 may be defined in the bank layer BK. For example, the opening may overlap each of the first, second and third light emitting areas LA1, LA2 and LA3. For example, the bank layer BK may entirely overlap the light blocking area BA, and may have a matrix shape in a plan view.

The bank layer BK may include an organic material. In an embodiment, the bank layer BK may include a light blocking material. For example, the bank layer BK may include at least one of black pigment, black dye, carbon black, and the like.

The color conversion layer CCL may be disposed under the first capping layer CPL1. The color conversion layer CCL may be disposed in the opening of the bank layer BK. In an embodiment, the color conversion layer CCL may include a first color conversion part CCL1, a second color conversion part CCL2 and a transmission part TL. Each of the first color conversion part CCL1, the second color conversion part CCL2 and the transmission part TL may overlap the first, second and third light emitting areas LA1, LA2 and LA3.

The first color conversion part CCL1 may overlap the first light emitting area LA1. For example, the first color conversion part CCL1 may include a resin part CCL1$a$, a scattering material CCL1$b$ and a wavelength conversion particle CCL1$c$.

The scattering material CCL1$b$ may increase an optical path by scattering incident light L1 without substantially changing a wavelength of the incident light L1 incident on the first color conversion part CCL1. In an embodiment, the scattering material CCL1$b$ may include a metal oxide or an organic material. The scattering material CCL1$b$ may be omitted. The wavelength conversion particle CCL1$c$ of the first color conversion part CCL1 may include quantum dots. The quantum dots may absorb the incident light L1 and emit light having a different wavelength from the incident light L1. For example, the wavelength conversion particle CCL1$c$ of the first color conversion part CCL1 may absorb the incident light L1 and emit red light.

The scattering material CCL1$b$ and the wavelength conversion particle CCL1$c$ may be disposed in the resin part CCL1$a$. For example, the resin part CCL1$a$ may include at least one of an epoxy-based resin, an acrylic-based resin, a phenol-based resin, a melamine-based resin, a cardo-based resin, an imide-based resin, and the like.

In an embodiment, the first color conversion part CCL1 may emit first transmission light L21 having red color by converting the incident light L1. The incident light L1 that is not converted by the first color conversion part CCL1 may be blocked by the first color filter CF1. Accordingly, in the first light emitting area LA1, the first transmission light L21 having red color may pass through the first base substrate SUB1, and may be emitted to the outside (e.g., in the first direction D1).

The second color conversion part CCL2 may overlap the second light emitting area LA2. For example, the second color conversion part CCL2 may include a resin part CCL2$a$, a scattering material CCL2$b$ and a wavelength conversion particle CCL2$c$. The resin part CCL2$a$ and the scattering material CCL2$b$ of the second color conversion part CCL2 may be substantially the same as or similar to the resin part CCL1$a$ and the scattering material CCL1$b$ of the first color conversion part CCL1.

The wavelength conversion particle CCL2$c$ of the second color conversion part CCL2 may include quantum dots that absorb incident light L1 and emit green light.

In an embodiment, the second color convert part CCL2 emit second transmission light L22 having green color by converting the incident light L1. The incident light L1 that is not converted by the second color conversion part CCL2 may be blocked by the second color filter CF2. Accordingly, in the second light emitting area LA2, the second transmission light L22 having green color may pass through the first base substrate SUB1, and may be emitted to the outside (e.g., in the first direction D1).

The transmission part TL may overlap the third light emitting area LA3. For example, the transmission part TL may include a resin part TLa and a scattering material TLb. The resin part TLa and the scattering material TLb of the transmission part TL may be substantially the same as or similar to the resin part CCL1$a$ and the scattering material CCL1$b$ of the first color conversion part CCL1.

In an embodiment, the transmission part TL may emit third transmission light L23 by transmitting the incident light L1. Some of the incident light L1 may be blocked by the third color filter CF3. Accordingly, in the third light emitting area LA3, the third transmission light L23 having blue color may pass through the first base substrate SUB1, and may be emitted to the outside (e.g., in the first direction D1).

However, the disclosure is not limited thereto, and the transmission part TL may convert the incident light L1 into third transmission light L23 having blue color. The transmission part TL may further include a wavelength conversion particle including quantum dots that absorb the incident light L1 and emit blue light.

As rays of the first, second and third transmission light L21, L22 and L23 emitted to the outside through the first base substrate SUB1 are combined in the first, second and third light emitting areas LA1, LA2 and LA3, an image may be displayed in the display area DA.

The second capping layer CPL2 may be disposed under the bank layer BK and the color conversion layer CCL, and may cover the bank layer BK and the color conversion layer CCL. The second capping layer CPL2 may protect the color conversion layer CCL from oxygen, moisture, foreign substances, and the like. In an embodiment, the second capping layer CPL2 may include an inorganic material. Examples of inorganic materials that may be used as the second capping layer CPL2 may include at least one of silicon oxide, silicon nitride, and the like. These may be used alone or in combination with each other.

In an embodiment, the second capping layer CPL2 may be disposed under the bank layer BK, and may overlap the display area DA, the peripheral area PA and the sealing area SA. For example, the second capping layer CPL2 may extend from the display area DA to the peripheral area PA and the sealing area SA.

The array substrate 200 may include a second base substrate SUB2, a buffer layer BFR, first, second and third driving diodes TR1, TR2 and TR3, an insulating layer IL, a pixel defining layer PDL, first, second and third light emitting diodes LED1, LED2 and LED3 and an encapsulation layer TFE.

The second base substrate SUB2 may face the first base substrate SUB1. The second base substrate SUB2 may include a transparent material or an opaque material. Examples of materials that may be used as the second base substrate SUB2 may at least one of include glass, plastic, and the like. In an embodiment, the second base substrate SUB2 may include the display area DA, the peripheral area PA and the sealing area SA.

The buffer layer BFR may be disposed on the second base substrate SUB2. In an embodiment, the buffer layer BFR may include an inorganic material. Examples of inorganic materials that may be used as the buffer layer BFR may include at least one of silicon oxide, silicon nitride, silicon oxynitride, and the like. These may be used alone or in combination with each other.

The first, second and third driving diodes TR1, TR2 and TR3 may be disposed on the buffer layer BFR. Each of the first, second and third driving diodes TR1, TR2 and TR3 may include at least one thin-film transistor. A channel layer of the thin-film transistor may include at least one of an oxide semiconductor, a silicon semiconductor, and the like. Examples of oxide semiconductors that may be used as the channel layer may include at least one of indium (In), gallium (Ga), tin (Sn), zirconium (Zr), vanadium (V), hafnium (Hf), cadmium (Cd), germanium (Ge), chromium (Cr), titanium (Ti), zinc (Zn), and the like. Examples of silicon semiconductors that may be used as the channel layer may include at least one of amorphous silicon, polycrystalline silicon, and the like. These may be used alone or in combination with each other.

The insulating layer IL may be disposed on the buffer layer BFR, and may cover the first, second and third driving diodes TR1, TR2 and TR3. The insulating layer IL may include an inorganic insulating layer and an organic insulating layer.

First, second and third pixel electrodes PE1, PE2 and PE3 may be disposed on the insulating layer IL. Each of the first, second and third pixel electrodes PE1, PE2 and PE3 may include a conductive material. Each of the first, second and third pixel electrodes PE1, PE2 and PE3 may have a single-layer or multi-layer structure.

Each of the first, second and third pixel electrodes PE1, PE2 and PE3 may contact the first, second and third driving diodes TR1, TR2 and TR3 through contact holes formed in the insulating layer IL.

The pixel defining layer PDL may be disposed on the first, second and third pixel electrodes PE1, PE2 and PE3. The pixel defining layer PDL may include an organic insulating material. An opening exposing at least a portion of each of the first, second and third pixel electrodes PE1, PE2 and PE3 may be defined in the pixel defining layer PDL.

A light emitting layer EL may be disposed on the first, second and third pixel electrodes PE1, PE2 and PE3 exposed by the opening of the pixel defining layer PDL. In an embodiment, the light emitting layer EL may continuously extend in the display area DA. In another embodiment, the light emitting layer EL may be separated from the light emitting layer EL of an adjacent pixel.

The light emitting layer EL may include at least one of an organic light emitting material and quantum dots. In an embodiment, the light emitting layer EL may generate blue light, but the disclosure is not limited thereto. In another embodiment, the light emitting layer EL may generate red light or green light, or may generate rays of light having different colors according to pixels.

In an embodiment, the light emitting layer EL may include an organic material for emitting blue light. The light emitting layer EL may be formed as multiple layers, and may have a structure in which blue organic light emitting layers are stacked each other. For example, the light emitting layer EL may have a structure in which three blue organic light emitting layers are stacked each other.

In another embodiment, the light emitting layer EL may have a structure in which blue organic light emitting layers and an organic light emitting layer emitting light of different colors are stacked each other. For example, the light emitting layer EL may have a structure in which three blue organic light emitting layers and a green organic light emitting layer are stacked each other. In still another embodiment, functional layers such as a hole injection layer, a hole transport layer, an electron transport layer and an electron injection layer may be disposed on and/or under the light emitting layer EL.

A common electrode CE may be disposed on the light emitting layer EL. The common electrode CE may include a conductive material. The common electrode CE may have a single-layer or multi-layer structure. In an embodiment, the common electrode CE may continuously extend in the display area DA.

The first pixel electrode PE1, the light emitting layer EL and the common electrode CE may form the first light emitting diode LED1, the second pixel electrode PE2, the light emitting layer EL and the common electrode CE my form the second light emitting diode LED2, and the third pixel electrode PE3, the light emitting layer EL and the common electrode CE may form the third light emitting diode LED3. Each of the first, second and third light emitting diodes LED1, LED2 and LED3 may overlap the color conversion layer CCL.

The encapsulation layer TFE may be disposed on the common electrode CE. The encapsulation layer TFE may include at least one inorganic encapsulation layer and at least one organic encapsulation layer. In an embodiment, the encapsulation layer TFE may include a first inorganic encapsulation layer IEL1 disposed on the common electrode CE, an organic encapsulation layer OEL disposed on the first inorganic encapsulation layer IEL1, and a second inorganic encapsulation layer IEL2 disposed on the organic encapsulation layer OEL.

Figure 4:
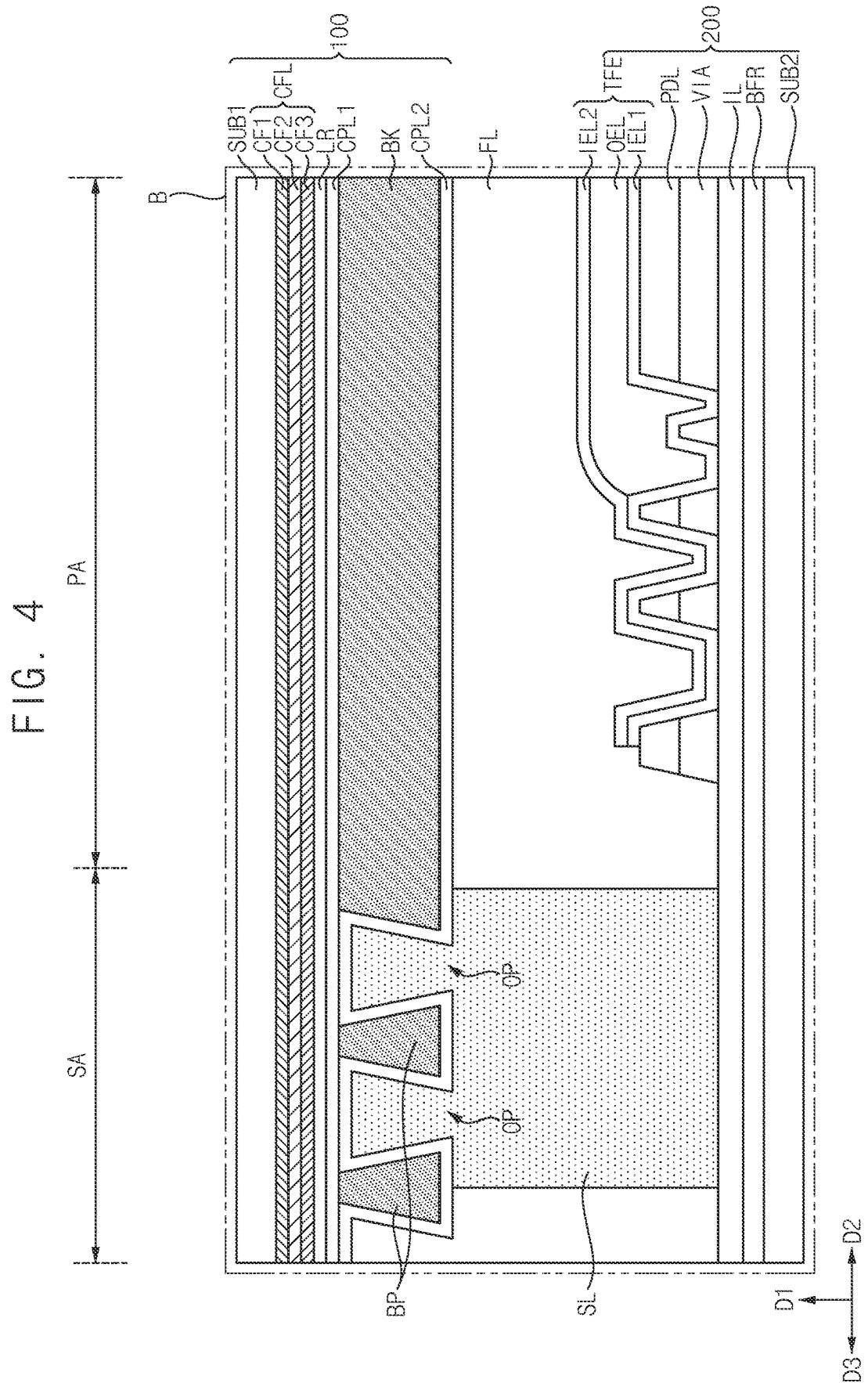
FIG. 4 is a schematic enlarged cross-sectional view of area B of FIG. 2.

FIG. 4 is a schematic enlarged cross-sectional view of area B of FIG. 2. For example, FIG. 4 may be a schematic cross-sectional view illustrating the peripheral area PA and the sealing area SA of the display device 10 of FIG. 1.

Referring to FIGS. 1, 2, 3 and 4, the color conversion substrate 100 may include the first base substrate SUB1, the color filter layer CFL, the low-refractive-index layer LR, the first capping layer CPL1, the bank layer BK and the second capping layer CPL2.

The color filter layer CFL may be disposed under the first base substrate SUB1. The color filter layer CFL may include the first color filter CF1, the second color filter CF2 and the third color filter CF3.

The color filter layer CFL overlapping the peripheral area PA and the sealing area SA may serve as a light blocking member. The first color filter CF1, the second color filter CF2 and the third color filter CF3 may overlap each other in the first direction D1 in the peripheral area PA and the sealing area SA. Accordingly, the color filter layer CFL may effectively block light traveling in the first direction D1 in the peripheral area PA and the sealing area SA.

For example, the first color filter CF1 may be disposed under the first base substrate SUB1, the second color filter CF2 may be disposed under the first color filter CF1, and the third color filter CF3 may be disposed under the second color filter CF2. However, the configuration of the disclosure is not limited thereto.

The low-refractive-index layer LR may be disposed under the color filter layer CFL, and the first capping layer CPL1 may be disposed under the low-refractive-index layer LR.

The bank layer BK may be disposed under the first capping layer CPL1. The bank layer BK may have a matrix shape in a plan view.

In an embodiment, the bank layer BK may include at least one bank pattern BP. The bank pattern BP may define an opening OP exposing a portion of the first capping layer CPL1. For example, the opening OP may penetrate the bank layer BK. In an embodiment, the bank pattern BP and the opening OP may overlap the sealing area SA.

The second capping layer CPL2 may be disposed under the bank layer BK. The second capping layer CPL2 may entirely cover the first capping layer CPL1 exposed by the bank layer BK and the opening OP in the peripheral area PA and the sealing area SA. For example, in an area overlapping the opening OP, the second capping layer CPL2 and the first capping layer CPL1 may contact each other.

The array substrate 200 may include the second base substrate SUB2, the buffer layer BFR, the insulating layer IL, a via insulating layer VIA, the pixel defining layer PDL, and the encapsulation layer TFE.

The second base substrate SUB2 may face the first base substrate SUB1. The buffer layer BFR may be disposed on the second base substrate SUB2, and the insulating layer IL may be disposed on the buffer layer BFR.

The via insulating layer VIA may be disposed on the insulating layer IL. The via insulating layer VIA may include an insulating material. Examples of insulating materials that may be used as the via insulating layer VIA may at least one of include photoresist, polyacrylic resin, polyimide resin, acrylic resin, and the like. These may be used alone or in combination with each other.

The pixel defining layer PDL may be disposed on the via insulating layer VIA. The pixel defining layer PDL may include an organic insulating material. Examples of organic insulating materials that may be used as the pixel defining layer PDL may include at least one of photoresist, polyacrylic resin, polyimide resin, acrylic resin, and the like. These may be used alone or in combination with each other.

The encapsulation layer TFE may be disposed on the pixel defining layer PDL. In an embodiment, the encapsulation layer TFE may include the first inorganic encapsulation layer IEL1 disposed on the pixel defining layer PDL, the organic encapsulation layer OEL disposed on the first inorganic encapsulation layer IEL1, and the second inorganic encapsulation layer IEL2 disposed on the organic encapsulation layer OEL.

In an embodiment, at least one dam may be disposed in the peripheral area PA. The dam may prevent an organic material from overflowing to the outside of the dam (e.g., in the third direction D3) during the formation of the organic encapsulation layer OEL.

The dam may be formed as a single layer in which an organic layer is stacked. For example, the dam and the via insulating layer VIA may include a same material. However, the disclosure is not limited thereto, and the dam may be formed as a multi-layer structure in which organic layers are stacked each other. For example, the dam may include a first layer and a second layer disposed on the first layer. The first layer and the via insulating layer VIA may include a same material, and the second layer and pixel defining layer PDL may include the same material.

The sealing member SL may be disposed between the second capping layer CPL2 and the second base substrate SUB2. The sealing member SL may be disposed between the second capping layer CPL2 and the insulating layer IL in the sealing area SA. For example, the sealing member SL may contact the second capping layer CPL2. In an embodiment, the sealing member SL may fill the opening OP of the bank layer BK in the sealing area SA.

The filler FL may be disposed between the second capping layer CPL2 and the second base substrate SUB2. The filler FL may be disposed between the second capping layer CPL2 and the encapsulation layer TFE in the peripheral area PA.

FIG. 5 is a schematic enlarged cross-sectional view of a bank pattern of FIG. 4.

Referring to FIGS. 4 and 5, the bank pattern BP may have a reversely tapered structure. The bank pattern BP may have a first surface PT adjacent to the first capping layer CPL1 and a second surface PB opposite to the first surface PT and adjacent to the second capping layer CPL2.

In an embodiment, a width WD of the bank pattern BP may increase from the first surface PT to the second surface PB. The width WD of the bank pattern BP may be defined as a length measured in the second direction D2 of the bank pattern BP in a cross-sectional view. For example, a second width W2 of the second surface PB may be greater than a first width W1 of the first surface PT.

In an embodiment, the first width W1 may be about 11 μm or less. For example, the first width W1 may be about 9.92 μm, but is not limited thereto. The second width W2 may be about 11 μm to about 17 μm. For example, the second width W2 may be about 11.38 μm, but is not limited thereto.

In an embodiment, a thickness TH of the bank pattern BP may be about 10 μm to about 13 μm. For example, the thickness TH of the bank pattern BP may be about 11.5 μm, but is not limited thereto. The thickness TH of the bank pattern BP may be defined as a length measured in the first direction D1 of the bank pattern BP in a cross-sectional view.

In the display device 10 according to an embodiment, the bank layer BK may be disposed in the display area DA, the peripheral area PA and the sealing area SA. The bank layer BK may include at least one bank pattern BP disposed in the sealing area SA and defining the opening OP. As the sealing member SL fills the opening OP, physical adhesion between the bank layer BK and the sealing member SL may be improved by increasing a contact area and contact density between the bank layer BK and the sealing member SL.

A gap between the color conversion substrate 100 and the array substrate 200 may be secured in the peripheral area PA and the sealing area SA. Edge defects of the display device 10 may be improved by reducing a difference (e.g., a step difference) between the gap in the display area DA and the gap in the peripheral area PA and the sealing area SA. Since a process for a separate column space is not required, a manufacturing process of the display device 10 may be simplified. Accordingly, reliability and productivity of the display device 10 may be improved.

Figure 8:
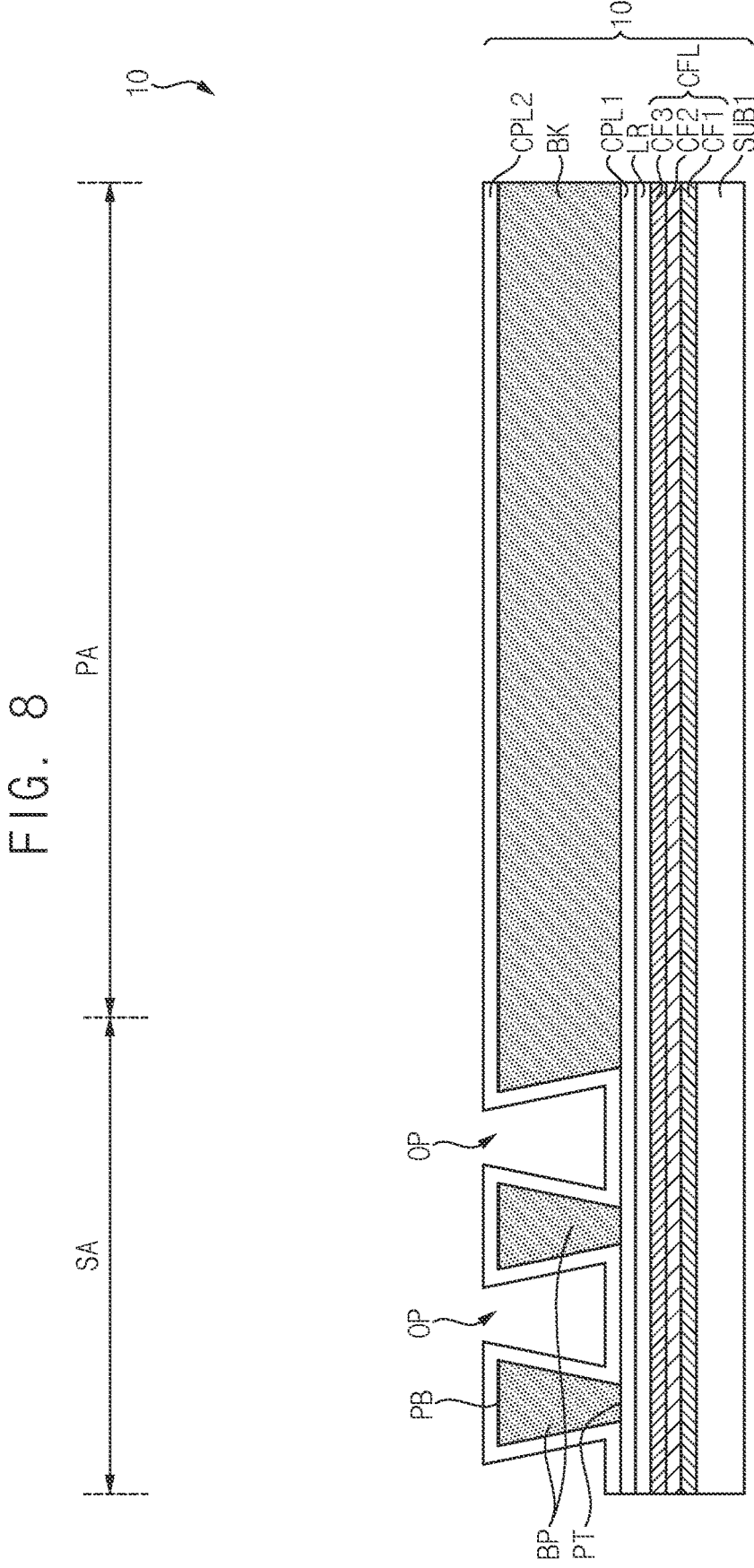

FIGS. 6, 7 and 8 are schematic cross-sectional views for illustrating a method of manufacturing a color conversion substrate included in the display device of FIG. 1. For example, FIGS. 6, 7 and 8 may be schematic cross-sectional views for illustrating a method of manufacturing the color conversion substrate 100 in the peripheral area PA and the sealing area SA.

Referring to FIG. 6, the color filter layer CFL may be formed in the peripheral area PA and the sealing area SA on the first base substrate SUB1. The first color filter CF1 may be formed on the first base substrate SUB1. The second color filter CF2 may be formed on the first color filter CF1. The third color filter CF3 may be formed on the second color filter CF2.

The low-refractive-index layer LR may be formed on the color filter layer CFL. The first capping layer CPL1 may be formed on the low-refractive-index layer LR. For example, the first capping layer CPL1 may be formed by a deposition process.

Referring to FIG. 7, the bank layer BK may be formed on the first capping layer CPL1. The bank layer BK may include a light blocking material.

Referring to FIG. 8, the bank layer BK may be patterned. In an embodiment, the bank layer BK may be entirely patterned in the display area DA, the peripheral area PA and the sealing area SA by a same photolithography process.

The bank layer BK may be etched through an exposure process and a development process. Accordingly, the bank pattern BP defining the opening OP overlapping the sealing area SA may be formed in the bank layer BK.

In an embodiment, as the bank layer BK has a relatively thick thickness of about 10 μm to about 13 μm and includes a light blocking material, the bank layer BK may be patterned so that a side surface of the bank pattern BP forms an angle (e.g., a predetermined or selectable angle). A width of the second surface PB adjacent to the second capping layer CPL2 may be greater than a width of the first surface PT adjacent to the first capping layer CPL1. For example, the bank pattern BP may have a reversely tapered structure.

The bank pattern BP may define the opening OP, and the opening OP may be formed through the bank layer BK. Accordingly, the opening OP may expose at least a portion of the first capping layer CPL1.

The second capping layer CPL2 may be formed on the bank layer BK. The second capping layer CPL2 may be formed to entirely cover the bank layer BK, the second surface PB of the bank pattern BP and the first capping layer CPL1 exposed by the opening OP in the peripheral area PA and the sealing area SA.

Figure 9:
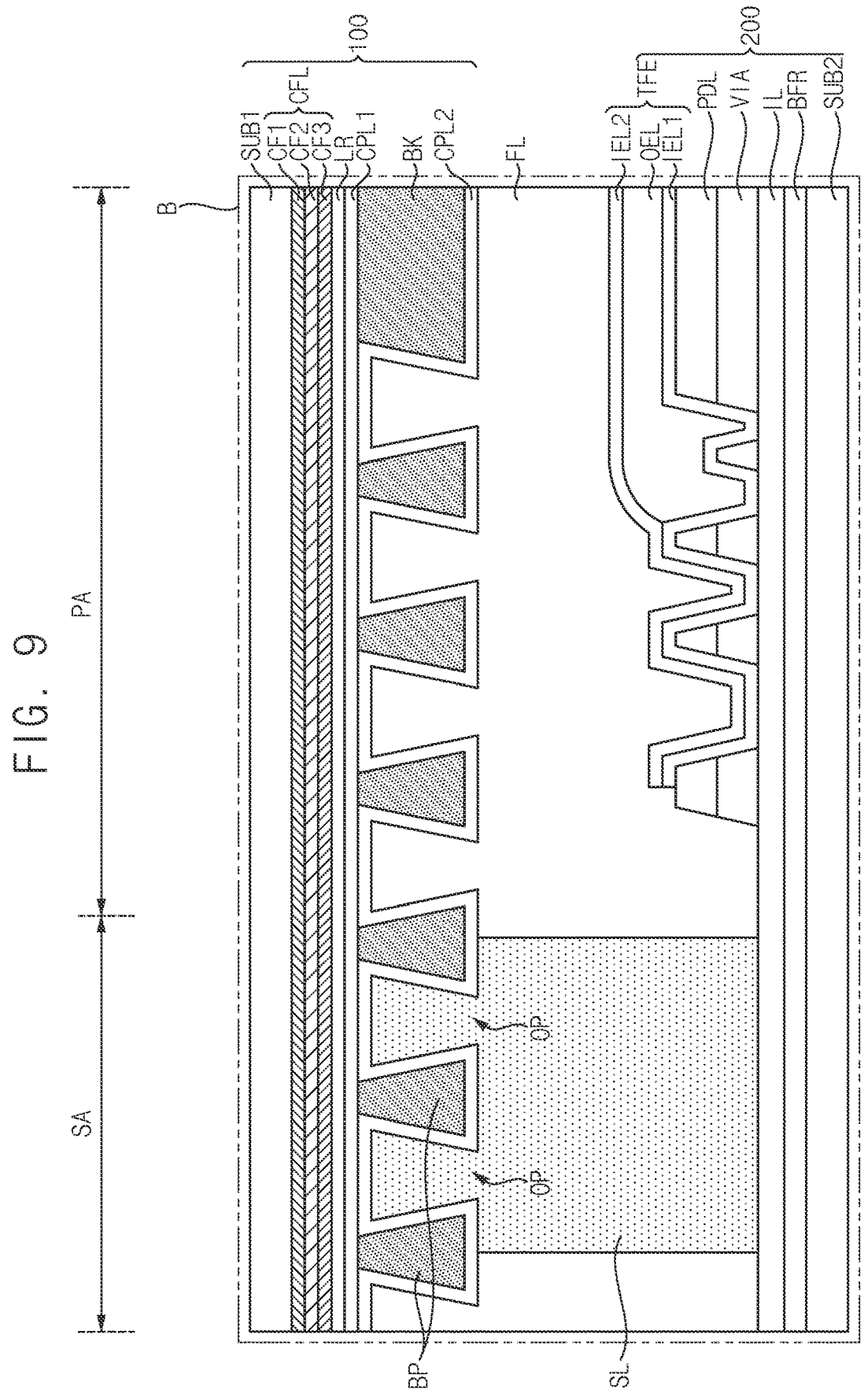
FIG. 9 is a schematic cross-sectional view illustrating another example of FIG. 4.

FIG. 9 is a schematic cross-sectional view illustrating another example of FIG. 4. Hereinafter, descriptions overlapping those of the display device 10 described with reference to FIG. 4 will be omitted or simplified.

The bank layer BK may include at least one bank pattern BP. The bank pattern BP may define the opening OP exposing a portion of the first capping layer CPL1. In an embodiment, the bank pattern BP and the opening OP may overlap the sealing area SA and the peripheral area PA.

In an embodiment, the sealing member SL may fill the opening OP of the bank layer BK in the sealing area SA. The filler FL may fill the opening OP of the bank layer BK in the peripheral area PA.

Figure 10:
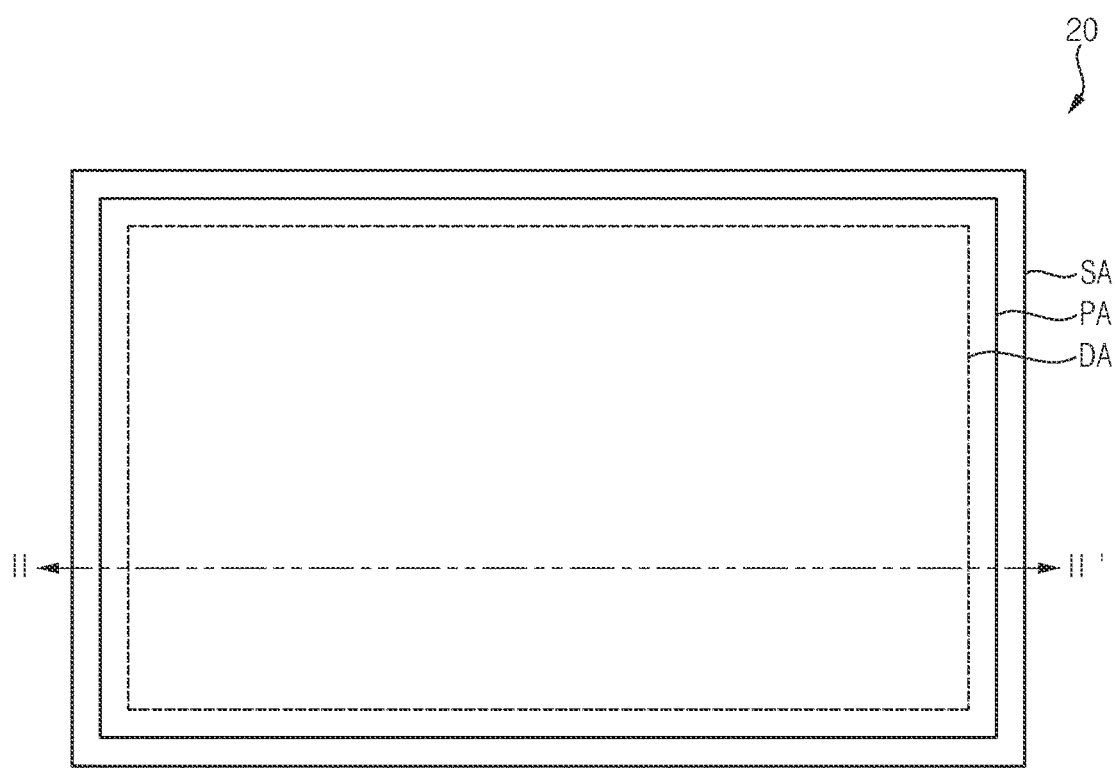
FIG. 10 is a schematic plan view for illustrating a display device according to another embodiment.
Figure 11:
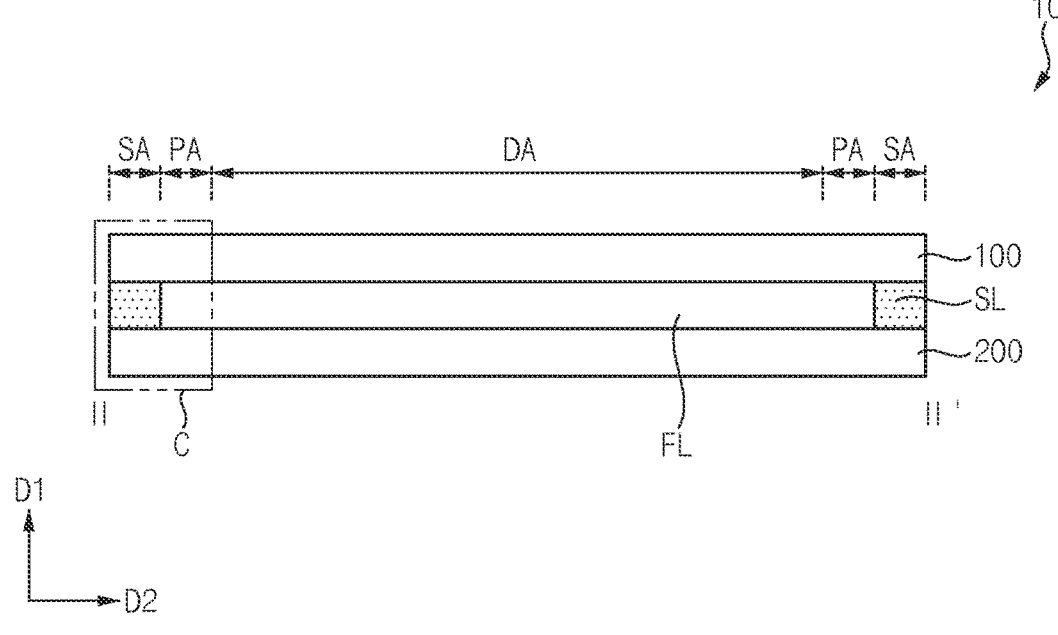
FIG. 11 is a schematic cross-sectional view taken along line II-IF of FIG. 10.

FIG. 10 is a schematic plan view for illustrating a display device according to another embodiment. FIG. 11 is a schematic cross-sectional view taken along line II-IF of FIG. 10, and FIG. 12 is a schematic enlarged cross-sectional view of area C of FIG. 11.

Figure 12:
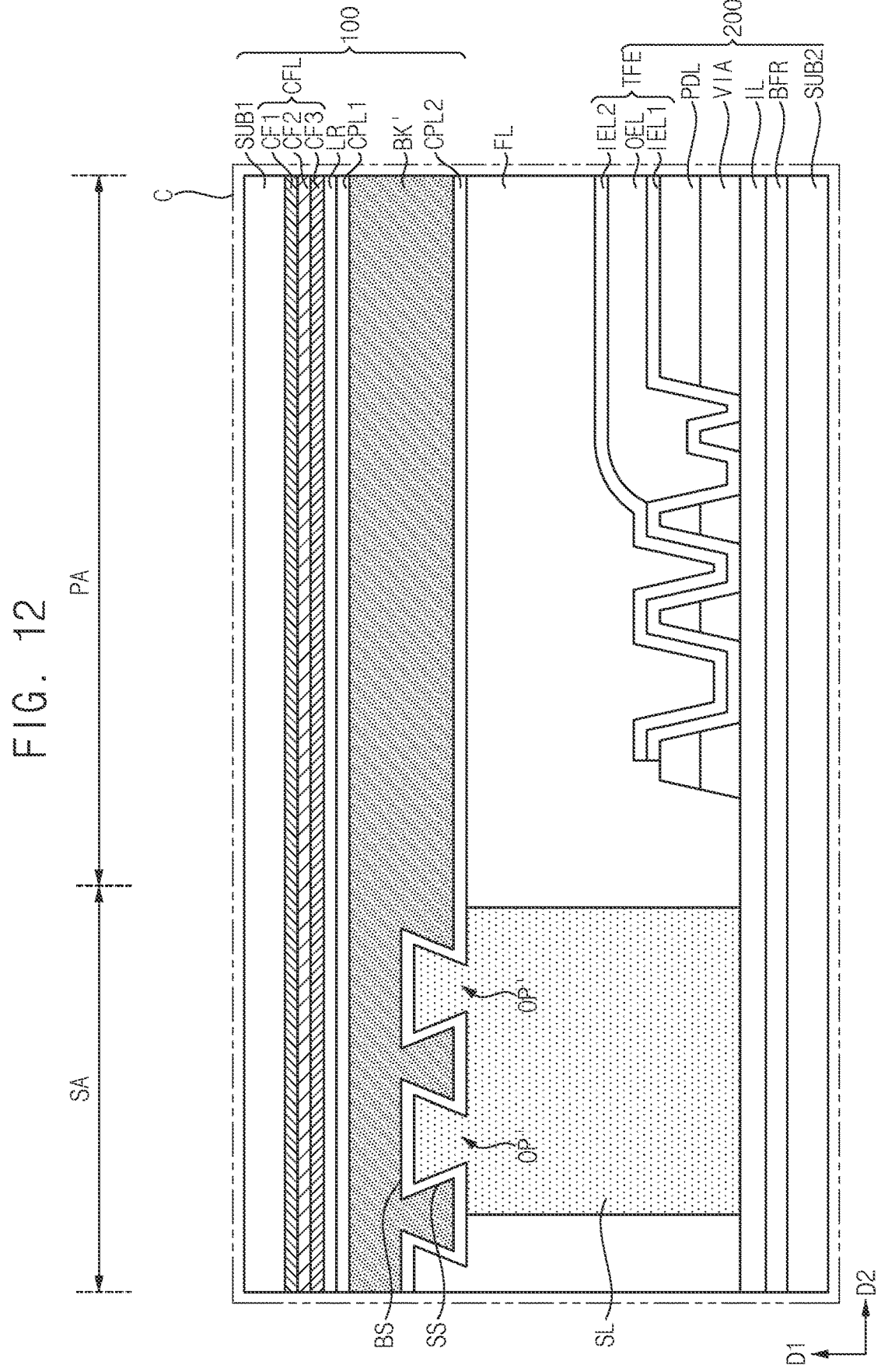
FIG. 12 is a schematic enlarged cross-sectional view of area C of FIG. 11.

Referring to FIGS. 10, 11 and 12, a display device 20 may include the color conversion substrate 100, the array substrate 200 and the sealing member SL. The color conversion substrate 100 may include the first base substrate SUB1, the color filter layer CFL, the low-refractive-index layer LR, the first capping layer CPL1, a bank layer BK' and the second capping layer CPL2. The array substrate 200 may include the second base substrate SUB2, the buffer layer BFR, the insulating layer IL, the via insulating layer VIA, the pixel defining layer PDL and the encapsulation layer TFE.

However, the display device 20 may be substantially the same as or similar to the display device 10 described with reference to FIGS. 1, 2, 3 and 4 except for the bank layer BK'. Hereinafter, descriptions overlapping those of the display device 10 described with reference to FIGS. 1, 2, 3 and 4 will be omitted or simplified.

Referring to FIG. 12, the color filter layer CFL, the low-refractive-index layer LR, the first capping layer CPL1 and the bank layer BK' may be sequentially disposed under the first base substrate SUB1.

Recesses OP' may be defined in the bank layer BK'. The recesses OP' may be recessed to a depth (e.g., a predetermined or selectable depth) from a lower surface of the bank layer BK', and a portion of the bank layer BK' may remain in an area overlapping the recesses OP'. In an embodiment, the recesses OP' may overlap the sealing area SA.

In an embodiment, a thickness of the bank layer BK' may be about 13 μm or less. The thickness of the bank layer BK' may be defined as a length, measured in the first direction D1, of the bank layer BK' in a cross-sectional view.

The second capping layer CPL2 may be disposed under the bank layer BK'. The second capping layer CPL2 may entirely cover the bank layer BK', side surfaces SS of the recesses OP' and bottom surfaces BS of the recesses OP' in the peripheral area PA and the sealing area SA. For example, in an area overlapping the recesses OP', the first capping layer CPL1 and the second capping layer CPL2 may be spaced apart from each other.

The sealing member SL may be disposed between the second capping layer CPL2 and the second base substrate SUB2 in the sealing area SA. The sealing member SL may fill the recesses OP' of the bank layer BK' in the sealing area SA.

Figure 13:
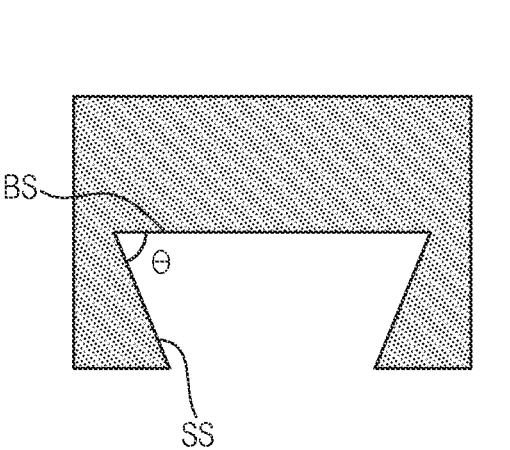
FIG. 13 is a schematic enlarged cross-sectional view of a recess of FIG. 12.

FIG. 13 is a schematic enlarged cross-sectional view of a recess of FIG. 12.

Referring to FIGS. 12 and 13, the recess OP' may include the side surface SS and the bottom surface BS. In an embodiment, the recess OP' may have a tapered structure. In other words, the recess OP' may include the side surface SS of an inclined structure, and the side surface SS of the recess OP' may have an acute inclination angle θ with respect to the bottom surface BS of the recess OP'.

Figure 15:
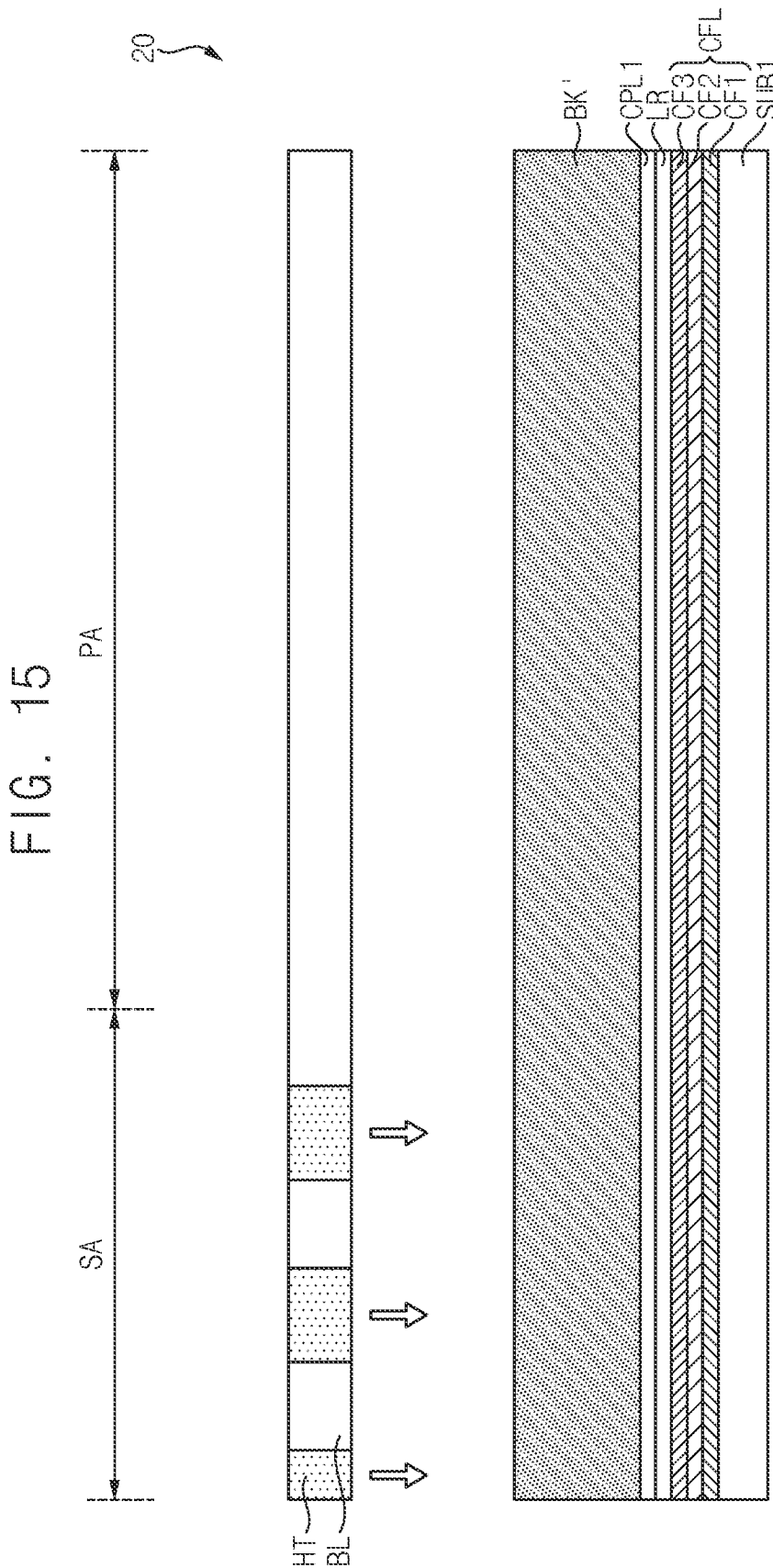

FIGS. 14, 15 and 16 are schematic cross-sectional views for illustrating a method of manufacturing a color conversion substrate included in the display device of FIG. 10. For example, FIGS. 14, 15 and 16 may be schematic cross-sectional views for illustrating a method of manufacturing the color conversion substrate 100 in the peripheral area PA and the sealing area SA.

Hereinafter, descriptions overlapping those of the method of manufacturing the display device 10 described with reference to FIGS. 6, 7 and 8 will be omitted or simplified.

Referring to FIG. 14, the color filter layer CFL, the low-refractive-index layer LR, the first capping layer CPL1 and the bank layer BK' may be sequentially formed in the peripheral area PA and the sealing area SA on the first base substrate SUB1.

Referring to FIGS. 15 and 16, the bank layer BK' may be patterned. In an embodiment, the bank layer BK' may be entirely patterned in the display area DA, the peripheral area PA and the sealing area SA by a same photolithography process.

The bank layer BK' may be etched through an exposure process and a development process. In an embodiment, a halftone mask may be used in the photolithography process. For example, the halftone mask may include a full-tone area, a halftone area HT and a blocking area BL.

Accordingly, the recesses OP' overlapping the sealing area SA may be formed in the bank layer BK'. As the halftone mask is used in the photolithography process, an etching amount of the bank layer BK' corresponding to the halftone area HT in the sealing area SA may be smaller than an etching amount of the bank layer BK' corresponding to the full-tone area in the display area DA. For example, the recesses OP' may be formed in the halftone area HT.

In an embodiment, as the bank layer BK' has a relatively thick thickness and includes a light blocking material, the recesses OP' may have a tapered structure.

In the display device 20 according to an embodiment, since the bank layer BK' is formed using the halftone mask, the recesses OP' having a depth smaller than the thickness of the bank layer BK' may be formed. Accordingly, since a gap between the recesses OP' and the array substrate 200 may be relatively small in the peripheral area PA and the sealing area SA, the sealing member SL and the filler FL may be fully filled.

FIG. 17 is a schematic cross-sectional view illustrating another example of FIG. 12. Hereinafter, descriptions overlapping those of the display device 20 described with reference to FIG. 12 will be omitted or simplified.

In an embodiment, the recesses OP' may be defined in the bank layer BK'. For example, the recesses OP' may be recessed to a depth (e.g., a predetermined or selectable depth) from the lower surface of the bank layer BK', and a portion of the bank layer BK' may remain in an area overlapping the recesses OP'. In an embodiment, the recesses OP' may overlap the sealing area SA and the peripheral area PA.

In an embodiment, the sealing member SL may fill the recesses OP' of the bank layer BK' in the sealing area SA. The filler FL may fill the recesses OP' of the bank layer BK' in the peripheral area PA.

The disclosure can be applied to various display devices. For example, the disclosure is applicable to various display devices such as display devices for vehicles, ships and aircraft, portable communication devices, display devices for exhibition or information transmission, medical display devices, and the like.

The above description is an example of technical features of the disclosure, and those skilled in the art to which the disclosure pertains will be able to make various modifications and variations. Thus, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:

1. A display device comprising:
a display area, a peripheral area disposed outside the display area, and a sealing area disposed outside the peripheral area;
a first base substrate;
a second base substrate facing the first base substrate;
a color filter layer disposed under the first base substrate;
a bank layer disposed under the color filter layer in the display area, the peripheral area, and the sealing area;
a sealing member disposed between the bank layer and the second base substrate in the sealing area; and
a filler disposed between the bank layer and the second base substrate in the display area and the peripheral area, wherein
the bank layer includes bank patterns defining an opening overlapping the sealing area and the peripheral area,
each of the bank patterns includes a first surface adjacent to the color filter layer and a second surface opposite to the first surface and adjacent to the sealing member,
a width of the second surface is greater than a width of the first surface,
a thickness of each of the bank patterns is about 10 μm to about 13 μm,
a level of a lower surface of the bank layer disposed in the peripheral area is equal to a level of a lower surface of the bank pattern,
the sealing member fills the opening overlapping the sealing area, and
the filler fills the opening overlapping the peripheral area.

2. The display device of claim 1, wherein the width of the second surface is about 11 μm to about 17 μm.

3. The display device of claim 1, wherein the width of the first surface is about 11 μm or less.

4. The display device of claim 1, wherein the bank layer includes a light blocking material.

5. The display device of claim 1, further comprising:
a first capping layer disposed between the color filter layer and the bank layer.

6. The display device of claim 5, further comprising:
a second capping layer covering the second surface of the bank patterns.

7. The display device of claim 6, wherein the second capping layer and the first capping layer contact each other in an area overlapping the opening in a plan view.

* * * * *